US012628667B2

(12) United States Patent (10) Patent No.: US 12,628,667 B2
Yoon et al. (45) Date of Patent: May 12, 2026

(54) SEMICONDUCTOR PACKAGE SUBSTRATE HAVING FRONT AND BACK SIDE RESIN-FILLED TRENCHES AND METHOD OF MANUFACTURING THE SAME

(71) Applicant: HAESUNG DS CO., LTD.,
Gyeongsangnam-do (KR)

(72) Inventors: Dong Jin Yoon, Gyeongsangnam-do
(KR); Sung Il Kang,
Gyeongsangnam-do (KR); In Seob Bae,
Gyeongsangnam-do (KR); **Seok Kyu
Seo, Gyeongsangnam-do (KR); Dong
Young Pyeon**, Gyeonggi-do (KR)

(73) Assignee: HAESUNG DS CO., LTD,
Gyeongsangnam-Do (KR)

( * ) Notice: Subject to any disclaimer, the term of this
patent is extended or adjusted under 35
U.S.C. 154(b) by 700 days.

(21) Appl. No.: 17/930,112

(22) Filed: Sep. 7, 2022

(65) Prior Publication Data

US 2023/0080101 A1 Mar. 16, 2023

(30) Foreign Application Priority Data

Sep. 15, 2021 (KR) ........................ 10-2021-0123112

(51) Int. Cl.
*H10W 70/60* (2026.01)
*H10W 42/00* (2026.01)
*H10W 76/15* (2026.01)
*H10W 90/00* (2026.01)
*H10W 99/00* (2026.01)

(52) U.S. Cl.
CPC ......... *H10W 70/60* (2026.01); *H10W 42/121*
(2026.01); *H10W 76/15* (2026.01); *H10W
99/00* (2026.01); *H10W 90/754* (2026.01)

(58) Field of Classification Search
CPC ............. H01L 23/495; H01L 23/49861; H01L
21/481; H01L 23/562
See application file for complete search history.

(56) References Cited

U.S. PATENT DOCUMENTS

2012/0223622 A1* 9/2012 Otsuki ................... H01L 23/552
310/344
2015/0116971 A1* 4/2015 Kozuki ................... H05K 3/247
427/97.1

(Continued)

FOREIGN PATENT DOCUMENTS

CN 206040633 U * 3/2017
JP 2018018864 A * 2/2018 ......... H01L 21/4821

(Continued)

*Primary Examiner* — Davienne N Monbleau
*Assistant Examiner* — Emily Farmer
(74) *Attorney, Agent, or Firm* — Perman & Green, LLP

(57) ABSTRACT

Provided are a semiconductor package substrate, a method
of manufacturing the semiconductor package substrate, and
a semiconductor package. According to one embodiment of
the present disclosure, a semiconductor package substrate
includes a base substrate having a lower surface in which a
first trench is provided and an upper surface in which a
second trench and a third trench are provided, including a
circuit pattern and a conductive material; a first resin
arranged in the first trench; and a second resin arranged in
the second trench and the third trench, wherein the second
trench exposes at least a part of the first resin.

15 Claims, 11 Drawing Sheets

(56) References Cited

U.S. PATENT DOCUMENTS

| 2018/0096923 | A1* | 4/2018 | Talledo | ............... | H01L 23/4952 |
| 2019/0267315 | A1* | 8/2019 | Bae | ....................... | H01L 21/486 |
| 2021/0098268 | A1* | 4/2021 | Pyeon | .................... | H01L 24/92 |

FOREIGN PATENT DOCUMENTS

| KR | 101999594 | 10/2019 |
| TW | 201913915 | 4/2019 |

* cited by examiner 110b
110
110a 120        111

SEMICONDUCTOR PACKAGE SUBSTRATE HAVING FRONT AND BACK SIDE RESIN-FILLED TRENCHES AND METHOD OF MANUFACTURING THE SAME

CROSS-REFERENCE TO RELATED APPLICATION

This application is based on and claims priority under 35 U.S.C. § 119 to Korean Patent Application No. 10-2021-0123112, filed on Sep. 15, 2021, in the Korean Intellectual Property Office, the disclosure of which is incorporated by reference herein in its entirety.

BACKGROUND

1. Field

Embodiments of the present disclosure relate to a semiconductor package substrate, a method of manufacturing the semiconductor package substrate, and a semiconductor package.

2. Description of the Related Art

A semiconductor device is packaged on a semiconductor package substrate to be used, and the semiconductor package substrate used for packaging includes a micro circuit pattern and/or input/output (I/O) terminals. As high performance and/or high integration of semiconductor devices and miniaturization and/or high performance of electronic devices using the semiconductor devices are realized, a line width and complexity of a micro circuit pattern of a semiconductor package substrate narrows and increases.

In recent years, a method of manufacturing a semiconductor package substrate by filling a conductive base substrate with an insulating material has been introduced to simplify a manufacturing process of the semiconductor package substrate.

SUMMARY

Embodiments of the present disclosure provide a semiconductor package substrate and a semiconductor package with excellent reliability, which are manufactured by a simple process, and a method of manufacturing the semiconductor package substrate.

The objects to be achieved by the present disclosure are not limited to the objects described above, and other objects not described will be clearly understood by those skilled in the art from descriptions of the present disclosure.

Additional aspects will be set forth in part in the description which follows and, in part, will be apparent from the description, or may be learned by practice of the presented embodiments of the disclosure.

According to one aspect of the present disclosure, a semiconductor package substrate includes a base substrate having a lower surface in which a first trench is provided and an upper surface in which a second trench and a third trench are provided, including a circuit pattern and a conductive material; a first resin arranged in the first trench; and a second resin arranged in the second trench and the third trench, wherein the second trench exposes at least a part of the first resin.

In one embodiment, the semiconductor package substrate may further include a mounting portion which is arranged on the upper surface of the base substrate and on which a semiconductor chip is mounted, wherein the third trench may be arranged to be farther from the mounting portion than the second trench, and a width of the third trench may be greater than a width of the second trench.

In one embodiment, the first resin and the second resin may be provided as a same type of resin.

In one embodiment, the semiconductor package substrate may further include a fourth trench arranged in the upper surface of the base substrate, wherein the fourth trench may be arranged along a cutting line.

In one embodiment, the second resin may be arranged in the fourth trench.

According to another aspect of the present disclosure, a method of manufacturing a semiconductor package substrate includes forming a first trench in a lower surface of a base substrate formed of a conductive material, filling the first trench with a first resin, forming a second trench and a third trench in an upper surface of the base substrate, and filling the second trench and the third trench with a second resin, wherein the second trench is formed to expose at least a part of the first resin.

In one embodiment, the upper surface of the base substrate may include a mounting portion on which a semiconductor chip is mounted, the third trench may be arranged to be farther from the mounting portion than the second trench, and a width of the third trench may be greater than a width of the second trench.

In one embodiment, the first resin and the second resin may be formed of a same type of resin.

In one embodiment, a fourth trench may be arranged in the upper surface of the base substrate further, and the fourth trench may be arranged along a cutting line.

In one embodiment, a fifth trench may be arranged in the lower surface of the base substrate, and the fifth trench may overlap the fourth trench.

According to another aspect of the present disclosure, a semiconductor package includes a base substrate having a lower surface in which a first trench is provided and an upper surface in which a second trench and a third trench are provided, having a circuit pattern formed in the base substrate, and formed of a conductive material; a first resin arranged in the first trench; a second resin arranged in the second trench and the third trench; a semiconductor chip arranged on the upper surface of the base substrate; and a cover configured to cover the semiconductor chip and including a bonding portion bonded to the base substrate, wherein the bonding portion is bonded to the second resin arranged in the third trench.

In one embodiment, the semiconductor package may further include an adhesive member arranged between the bonding portion and the second resin.

In one embodiment, a width of the third trench may be greater than a width of the second trench.

In one embodiment, the first resin and the second resin may be formed of a same type of resin.

In one embodiment, the semiconductor package may further include a fourth trench provided in an edge of the base substrate, wherein the second resin may be arranged in the fourth trench.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
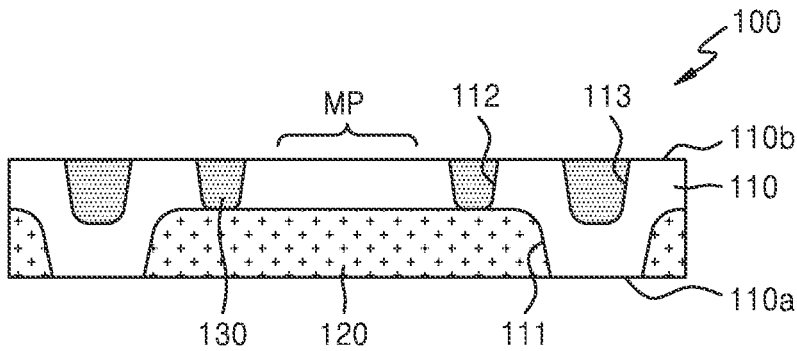
FIG. 1 is a schematic cross-sectional view of a semiconductor package substrate according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The present embodiments may be transformed in various ways, and thus, specific embodiments are illustrated in the drawings and described in detail in the detailed description. Effects and features of the present embodiments, and a method of achieving the effects and features will be clear by referring to the details described below in conjunction with the drawings. However, the present embodiments are not limited to the embodiments described below and may be implemented in various forms.

Hereinafter, the following embodiments will be described in detail with reference to the accompanying drawings, and when described with reference to the drawings, the same or corresponding components are given the same reference numerals, and redundant descriptions thereof are omitted.

In the following embodiments, terms such as first and second are used for the purpose of distinguishing one component from another component, not in a limiting sense.

In the following embodiments, the singular expression includes the plural expression unless the context clearly dictates otherwise.

In the following embodiments, terms such as include or have means that features or components described in the specification exist, and a possibility that one or more other features or components will be added is not excluded in advance.

In the following embodiments, when it is described that a portion such as a film, a region, a component, or so on is on (or above) or under (below) another portion, this includes not only a case in which the portion is directly above or below another portion, but also a case in which there is another film, another region, another component, or so on therebetween. Criteria of above and below will be described with reference to the drawings.

In the drawings, size of components may be exaggerated or reduced for the sake of convenience of description. For example, a size and a thickness of each component illustrated in the drawings are randomly illustrated for the sake of convenience of description, and thus, the following embodiments are not limited to the illustration.

FIG. 1 is a schematic cross-sectional view of a semiconductor package substrate according to an embodiment of the present disclosure.

Referring to FIG. 1, in a semiconductor package substrate 100 according to an embodiment of the present disclosure, a first resin 120 and a second resin 130, each of which is formed of an insulating material, are respectively filled in a lower surface 110a and an upper surface 110b of a base substrate 110 formed of a conductive material.

Here, the upper surface 110b of the base substrate 110 may refer to a side on which a semiconductor chip is provided when a semiconductor package is manufactured by using the semiconductor package substrate 100, and the lower surface 110a may refer to an opposite side of the upper surface 110b.

The base substrate 110 forms a part of the semiconductor package substrate 100, and after processing, a circuit pattern, such as a mounting portion MP on which a semiconductor chip is mounted, a wiring pattern, and a terminal portion connected to the outside, may be formed.

The base substrate 110 may be formed of an electrically conductive material and may have a flat plate shape. The base substrate 110 may be formed of a single material, such as Cu or Fe, and may be formed of various materials, for example, a copper alloy, such as Cu—Sn, Cu—Zr, Cu—Fe or Cu—Zn, an iron alloy, such as Fe—Ni or Fe—Ni—Co, and so on. In addition, a commercially available lead frame material may also be used as a material of the base substrate 110.

A first trench 111 may be provided in the lower surface 110a of the base substrate 110, and a second trench 112 and a third trench 113 may be provided in the upper surface 110b of the base substrate 110. Exposed portions of the base substrate 110 in which the first to third trenches 111 to 113 are not formed and the first and second resins 120 and 130 are not provided may function as terminals for electrical connection to a semiconductor chip or an external circuit board.

The first trench 111 may indicate a groove formed in a direction from the lower surface 110a of the base substrate 110 to the upper surface 110b thereof. The first trench 111 does not penetrate the base substrate 110, and thus, the depth of the first trench 111 may be less than the thickness of the base substrate 110.

The first resin 120 may be arranged in the first trench 111. That is, the first resin 120 may fill the inside of the first trench 111. The first resin 120 forms the semiconductor package substrate 100 together with the base substrate 110. The first resin 120 may protect the base substrate 110 and maintain the strength of the base substrate 110.

The first resin 120 may include a thermoplastic resin or a thermosetting resin. In some embodiments, the first resin 120 may include about 80% to about 90% or more of silica to reduce thermal expansion. Filling of the first resin 120 may also be made by using a liquid resin material or solid tape including a resin component.

The second trench 112 and the third trench 113 may be grooves formed in a direction from the upper surface 110b of the base substrate 110 to the lower surface 110a thereof.

The second trench 112 may partially expose the first resin 120. In addition, the third trench 113 may not expose the first resin 120.

The mounting portion MP, on which a semiconductor chip is to be mounted, may be arranged on the upper surface 110*b* of the base substrate 110. The second trench 112 may be arranged to be close to the mounting portion MP, and the third trench 113 may be arranged to be farther from the mounting portion MP than the second trench 112. The width and/or depth of the third trench 113 may be greater than the width and/or depth of the second trench 112. Here, the width may indicate the shortest distance traversed when a trench is viewed in a plan view.

The second resin 130 may be arranged in the second trench 112 and the third trench 113. That is, the second resin 130 may fill the insides of the second trench 112 and the third trench 113. The second resin 130 forms the semiconductor package substrate 100 together with the base substrate 110. The second resin 130 may protect the base substrate 110 and maintain the strength of the base substrate 110.

The second resin 130 filled in the second trench 112 may be arranged between circuit patterns and may electrically insulate the circuit patterns from each other. The second trench 112 may be formed such that the first resin 120 is partially exposed. Accordingly, circuit patterns formed on the base substrate 110 may be insulated from each other. The second resin 130 filling the inside of the second trench 112 may be in contact with the first resin 120.

The second resin 130 filled in the third trench 113 may be connected to a cover for protecting the semiconductor chip later to increase adhesion.

The second resin 130 may be formed of the same material as the first resin 120. For example, the second resin 130 may include a thermoplastic resin or a thermosetting resin. In some embodiments, the second resin 130 may include silica of about 80% to about 90% or more to reduce thermal expansion. Filling of the second resin 130 may also be made by using a liquid resin material or solid tape including a resin component.

When the first resin 120 and the second resin 130 are formed of the same kind of resin, there is no difference in thermal expansion coefficients of both surfaces of the semiconductor package substrate 100 because resins arranged on both surfaces of the base substrate 110 are the same type, and thus, warping of the semiconductor package substrate 100 may be more effectively prevented.

Figure 2:
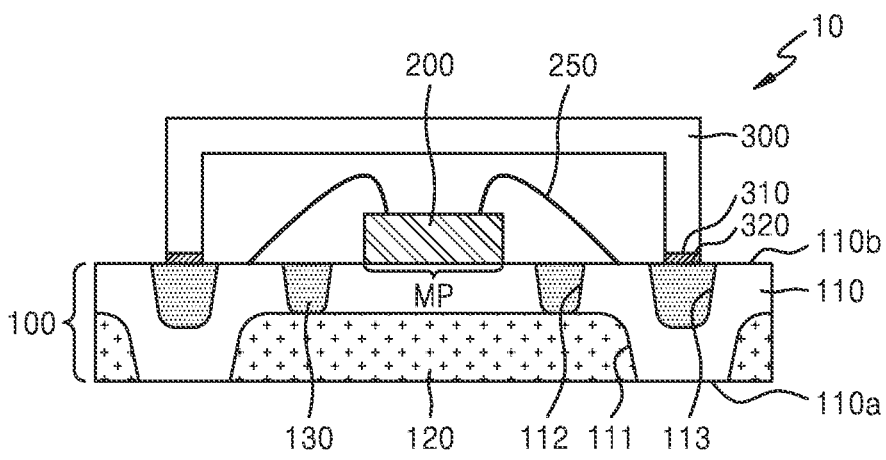
FIG. 2 is a schematic cross-sectional view of a semiconductor package according to an embodiment of the present disclosure.

FIG. 2 is a cross-sectional view illustrating a semiconductor package 10 in which a semiconductor chip is mounted on the semiconductor package substrate 100 of FIG. 1. In FIG. 2, the same reference numerals as in FIG. 1 denote the same members, and redundant descriptions thereof are omitted.

Referring to FIG. 2, the semiconductor package 10 includes a semiconductor chip 200 mounted on the semiconductor package substrate 100 and a cover 300 that covers the semiconductor chip 200. The cover 300 may include a bonding portion 310 that is bonded to the semiconductor package substrate 100.

The base substrate 110 of the semiconductor package substrate 100 includes the first trench 111 in the lower surface 110*a*, and the first resin 120 may fill the first trench 111. In addition, the base substrate 110 may include the second trench 112 and the third trench 113 in the upper surface 110*b*, and the second resin 130 may fill the second trench 112 and the third trench 113.

The semiconductor chip 200 may be mounted on the mounting portion MP provided on the upper surface 110*b* of the base substrate 110. In this case, a portion on which the semiconductor chip 200 is mounted may be referred to as a die pad. The semiconductor chip 200 may be connected to a lead region of the base substrate 110 by a wire 250. One end of the wire 250 may be bonded to the semiconductor chip 200, and the other end of the wire 250 may be connected to a lead region of the upper surface 110*b* of the base substrate 110.

The cover 300 may protect the semiconductor chip 200 from external air, such as moisture, and mechanical shock and may block electromagnetic waves. The cover 300 may be formed of metal.

The cover 300 may be formed to have a shape surrounding the upper surface and side surfaces of the semiconductor chip 200. The cover 300 may include an accommodation portion in which the semiconductor chip 200 is accommodated and the bonding portion 310, which is bonded to the semiconductor package substrate 100. The bonding portion 310 of the cover 300 may be arranged to correspond to the third trench 113 of the semiconductor package substrate 100. The bonding portion 310 may be bonded to the second resin 130 arranged in the third trench 113.

In some embodiments, an adhesive member 320 may be further arranged between the bonding portion 310 and the second resin 130. The adhesive member 320 may be formed of an epoxy resin.

The base substrate 110 according to the present application may be formed of a conductive material, and thus, when the base substrate 110 is bonded to the cover 300 through the adhesive member 320, an adhesive force may be weak.

In the present embodiment, the bonding portion 310 of the cover 300 is arranged to correspond to the third trench 113, and the bonding portion 310 of the cover 300 is bonded to the second resin 130 arranged in the third trench 113 through the adhesive member 320, and thus, the cover 300 may be stably bonded to the base substrate 110.

In addition, according to the present embodiment, the semiconductor package substrate 100 includes the base substrate 110 having a lower side and an upper side respectively filled with the first resin 120 and the second resin 130 to prevent the semiconductor package substrate 100 from being distorted by thermal expansion and thermal contraction, and thus, the semiconductor chip 200 may be stably mounted.

In addition, in another embodiment, a region corresponding to the bonding portion 310 of the cover 300 may not be provided with the third trench 113 and may be provided with the second resin 130 in the form of solid tape to correspond to the bonding portion 310.

FIGS. 3 to 8 are schematic cross-sectional views sequentially illustrating processes of manufacturing the semiconductor package substrate 100, according to an embodiment of the present disclosure.

Figure 3:
FIGS. 3 to 8 are cross-sectional views sequentially illustrating a method of manufacturing a semiconductor package substrate, according to an embodiment of the present disclosure.

First, as illustrated in FIG. 3, the base substrate 110 is prepared. The base substrate 110 may be formed of an electrically conductive material. The base substrate 110 may include Cu, a Cu alloy, such as Cu—Sn, Cu—Zr, Cu—Fe, or Cu—Zn, Fe, an Fe alloy, such as Fe—Ni or Fe—Ni—Co, or so on. The base substrate 110 includes the upper surface 110*b* on which a semiconductor chip is to be mounted and the lower surface 110*a* that is an opposite surface of the upper surface 110*b*. In some embodiments, the thickness of the base substrate 110 may be about 0.1 mm to about 0.3 mm.

Figure 4:
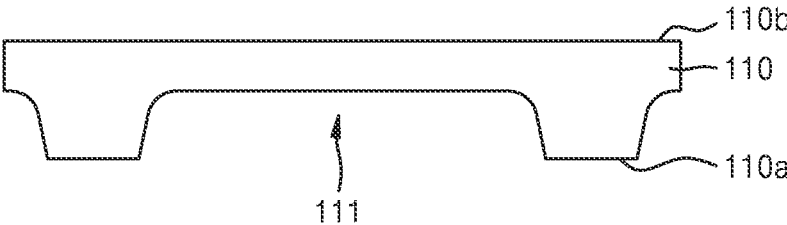

Next, the lower surface 110a of the base substrate 110 is processed to form the first trench 111 illustrated in FIG. 4. Here, a trench means that the base substrate 110 is not completely penetrated.

An etching method may be used as a method of processing the lower surface 110a of the base substrate 110. In one embodiment, wet etching may be used as the etching method. In a specific example of the etching method, a dry film resist formed of a photosensitive material is arranged on the lower surface 110a of the base substrate 110, the dry film resist is exposed and developed, and thus, a resist pattern is formed by the dry film resist. Next, the first trench 111 may be formed by etching the base substrate 110 with an etching solution, such as copper chloride or iron chloride, by using a spraying method.

The depth of the first trench 111 may be about 50% to about 90% of the thickness of the base substrate 110. In some embodiments, the depth of the first trench 111 may be about 70 μm to about 200 μm. The depth of the first trench 111 may be adjusted considering handling easiness of a semiconductor package substrate and process conditions of patterning of the upper surface 110b in a subsequent process.

Figure 5:
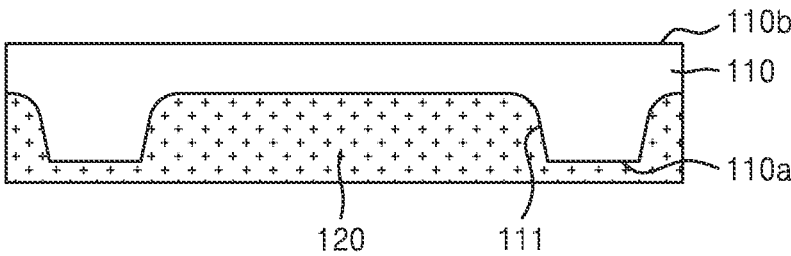

Next, as illustrated in FIG. 5, the first trench 111 is coated with the first resin 120.

It is sufficient if the first resin 120 is formed of an insulating material that is not electrically conductive. For example, the first resin 120 may include a thermosetting resin that is polymerized and cured by heat treatment. The first resin 120 may include a liquid resin. Alternatively, the first resin 120 may be formed with solid tape including a resin component. In one embodiment, the first resin 120 may be cured by a curing process after coating the first trench 111. The curing process may be performed by an oven or an infrared heater.

Figure 6:
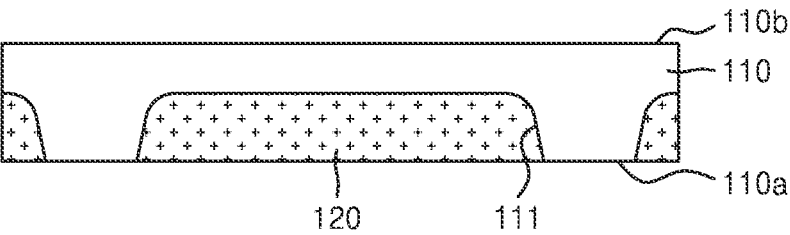

As illustrated in FIG. 5, the first resin 120 may include a portion arranged in the first trench 111 and a portion that partially covers the lower surface 110a. In this case, as illustrated in FIG. 6, the lower surface 110a of the base substrate 110 may be exposed by a laser process, a brushing process, a polishing process, an etching process, or so on. Accordingly, the first resin 120 may be only inside the first trench 111.

Before filling the first trench 111 with the first resin 120, a rough process of roughening the inner surface of the first trench 111 may be performed. Through this, a bonding force between the base substrate 110 and the first resin 120 may increase. In order to roughen the inner surface of the first trench 111 of the base substrate 110, plasma treatment, UV treatment, or a persulfate-based solution may be used, and in this case, the roughness of the inner surface of the first trench 111 of the base substrate 110 may be 150 nm or more (rms).

Figure 7:
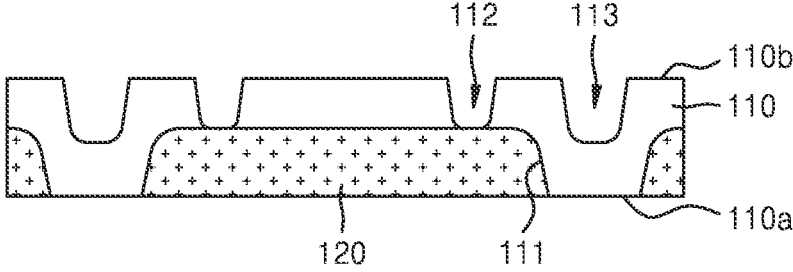

Then, as illustrated in FIG. 7, the upper surface 110b of the base substrate 110 is processed to form the second trench 112 and the third trench 113.

An etching method may be used as a method of processing the upper surface 110b of the base substrate 110. In one embodiment, wet etching may be used as the etching method. In a specific example of the etching method, a dry film resist formed of a photosensitive material is arranged on the upper surface 110b of the base substrate 110, the dry film resist is exposed and developed, and thus, a resist pattern is formed by the dry film resist. Next, the second trench 112 and the third trench 113 may be formed by etching the base substrate 110 with an etching solution, such as copper chloride or iron chloride, by using a spraying method.

In some embodiments, the width and depth of the second trench 112 may be different from the width and depth of the third trench 113. For example, the width and depth of the third trench 113 may be greater than the width and depth of the second trench 112. The width and depth of the third trench 113 may be determined considering the size of a bonding portion of the cover 300 (refer to FIG. 2) to be arranged to correspond to the third trench 113 later.

In addition, a part of the second trench 112 may be formed such that the first resin 120 is exposed above the base substrate 110. Accordingly, circuit patterns insulated from each other may be formed on the upper surface of the base substrate 110. The third trench 113 may be formed where the bonding portion of the cover 300 is to be arranged. The third trench 113 may be arranged to surround the mounting portion MP of the semiconductor chip 200 (refer to FIG. 2). The third trench 113 may be arranged outer from the second trench 112.

Figure 8:
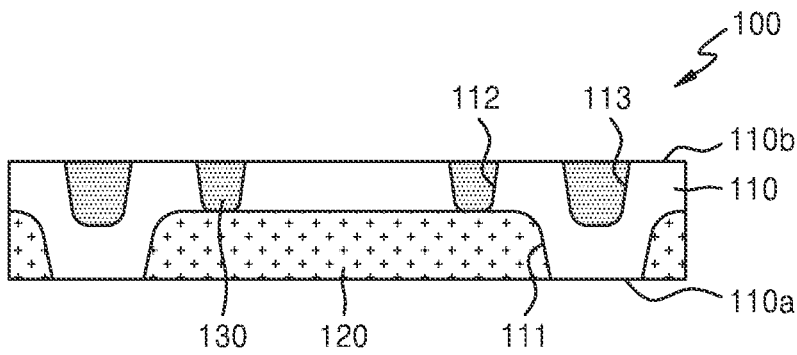

Next, as illustrated in FIG. 8, the second trench 112 and the third trench 113 may be coated and filled with the second resin 130.

It is sufficient if the second resin 130 is formed of an insulating material that is not electrically conductive. For example, the second resin 130 may include a thermosetting resin that is polymerized and cured by heat treatment. The second resin 130 may include a liquid resin. Alternatively, the second resin 130 may be formed with solid tape including a resin component. In one embodiment, the second resin 130 may be cured by a curing process after coating the second trench 112 and the third trench 113. The curing process may be performed by an oven or an infrared heater.

The second resin 130 may include portions arranged in the second trench 112 and the third trench 113 and a portion that partially covers the upper surface 110b. In this case, the upper surface 110b of the base substrate 110 may be exposed by a laser process, a brushing process, a polishing process, an etching process, or so on. Accordingly, the second resin 130 may be only inside the second trench 112 and the third trench 113.

Before filling the second trench 112 and the third trench 113 with the second resin 130, a rough process of roughening inner surfaces of the second trench 112 and the third trench 113 may be performed. Through this, a bonding force between the base substrate 110 and the second resin 130 may increase. Plasma treatment, UV treatment, or a persulfate-based solution may be used for the rough process, and in this case, the roughness of the inner surfaces of the second trench 112 and the third trench 113 of the base substrate 110 may be 150 nm or more (rms).

In addition, an exposed portion of the base substrate 110, which is not covered with the first resin 120 and the second resin 130, may function as a terminal for electrical connection to a semiconductor chip or an external circuit board. Accordingly, an additional process may be performed on the exposed portion of the base substrate 110. For example, at least a part of the lower surface 110a and the upper surface 110b of the base substrate 110 may be plated with Au, Pd, or so on, or organic solderability preservative (OSP) coating may be performed thereon to increase solder adhesion in a subsequent process.

FIGS. 3 to 8 partially illustrate the semiconductor package substrate 100 having a flat plate shape, but embodiments of the present disclosure may also be applicable to a manufacturing method by which the semiconductor package substrate 100 is wound in a reel type.

Figure 9:
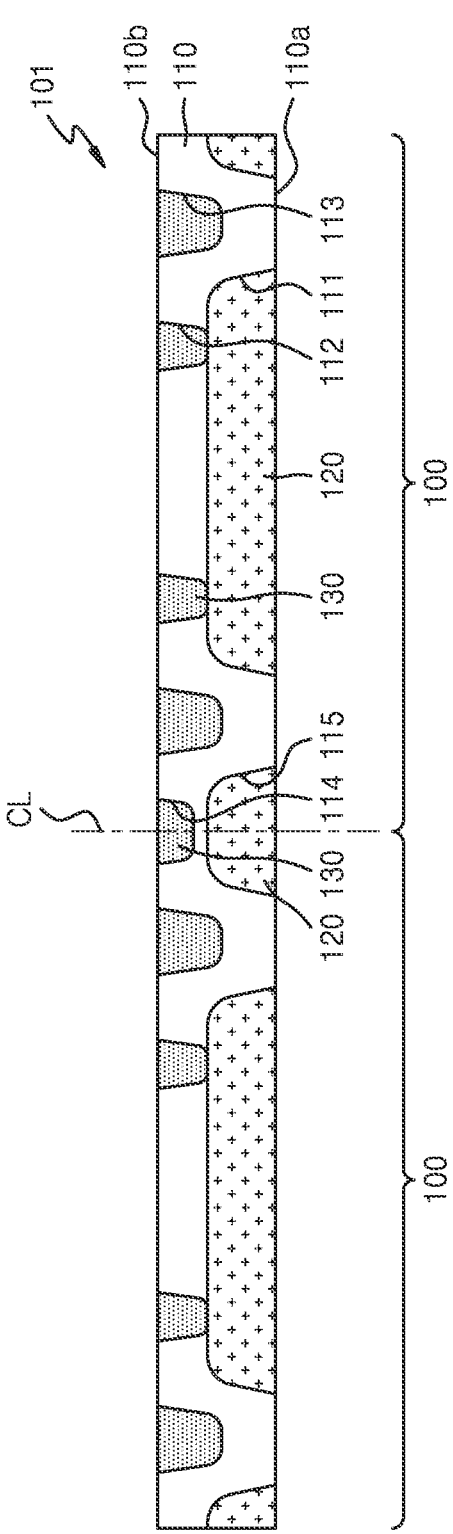
FIG. 9 is a schematic cross-sectional view of a semiconductor package substrate according to an embodiment of the present disclosure.
Figure 10:
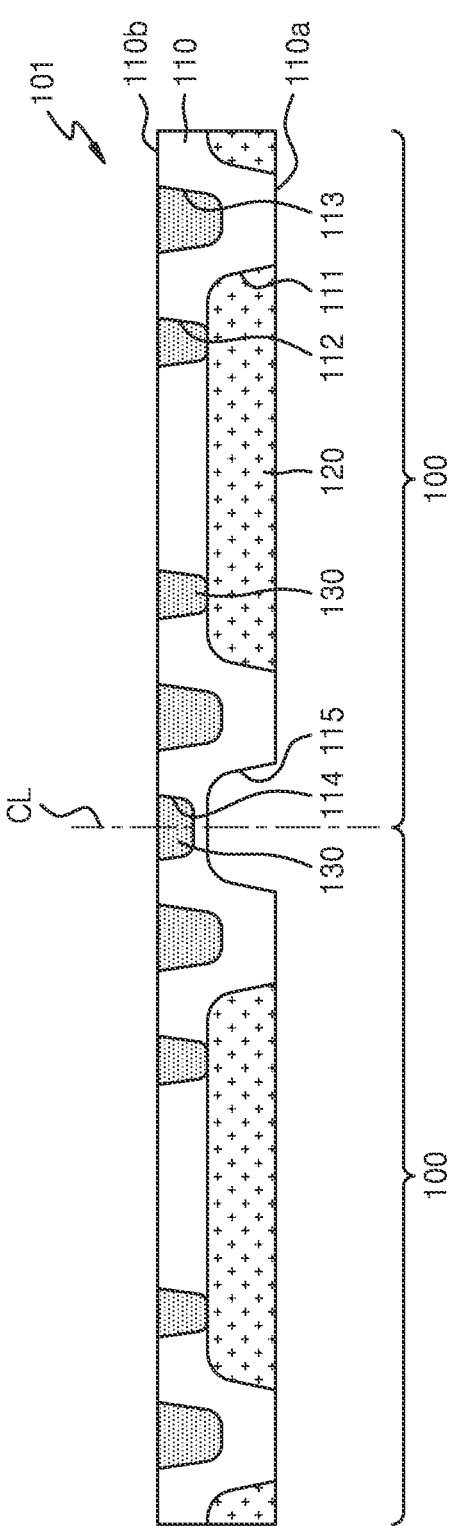
FIG. 10 is a schematic cross-sectional view of a semiconductor package substrate according to an embodiment of the present disclosure.

FIGS. 9 and 10 are cross-sectional views schematically illustrating a semiconductor package substrate 101 according to embodiments of the present disclosure. In FIGS. 9 and 10, the same reference numerals as in FIG. 1 denote the same members, and redundant descriptions thereof are omitted.

Referring to FIG. 9, the semiconductor package substrate 101 may include a plurality of semiconductor package substrates 100 connected to each other. The semiconductor package substrate 101 may be configured by integrally forming the plurality of semiconductor package substrates 100, and then the semiconductor package substrate 101 may be separated into semiconductor package substrates 100 by being cut along a cutting line CL.

The semiconductor package substrate 101 according to the present embodiment may further include a fourth trench 114 in the upper surface 110b of the base substrate 110 to correspond to the cutting line CL. The fourth trench 114 may include a groove formed in a direction from the upper surface 110b of the base substrate 110 to the lower surface 110a thereof.

In one embodiment, the fourth trench 114 may be coated with the second resin 130. Accordingly, abrasion of the sawing blade used in the cutting process may be significantly reduced.

In addition, a fifth trench 115 may be provided in the lower surface 110a of the base substrate 110 to correspond to the cutting line CL. The fifth trench 115 may include a groove formed in a direction from the lower surface 110a of the base substrate 110 to the upper surface 110b thereof. The fifth trench 115 may be arranged to overlap the fourth trench 114.

The first resin 120 may be arranged in the fifth trench 115, as illustrated in FIG. 9, or the first resin 120 may not be arranged in the fifth trench 115, as illustrated in FIG. 10. Accordingly, there is an advantage in that the thickness of the cut portion in the base substrate 110 is small such that cutting may be easily performed.

Figure 11:
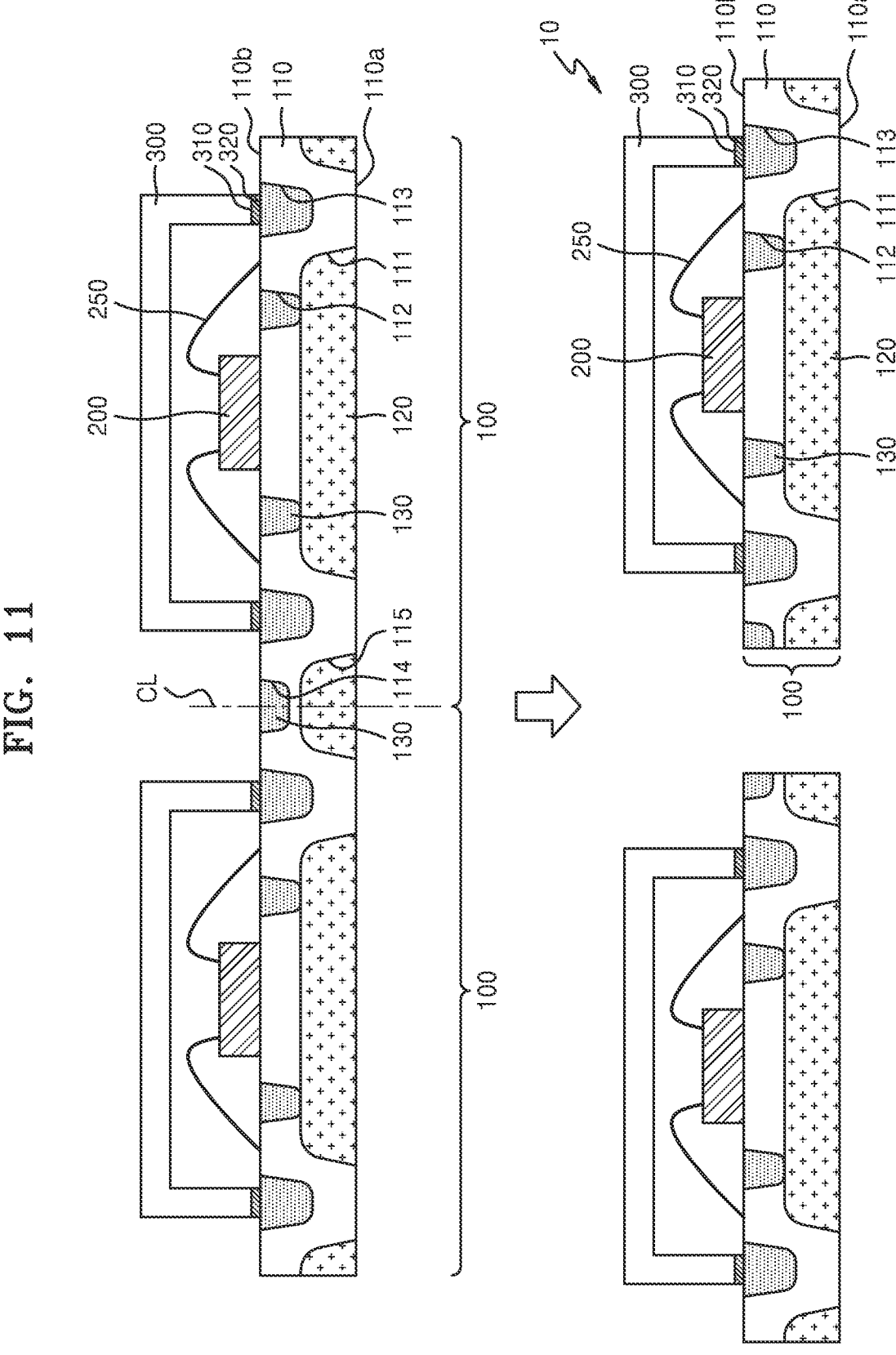
FIG. 11 illustrates cross-sectional views schematically illustrating a process of forming a semiconductor package after a semiconductor chip is mounted on the semiconductor package substrate of FIG. 9.

FIG. 11 illustrates cross-sectional views schematically illustrating processes of forming a semiconductor package after a semiconductor chip is mounted on the semiconductor package substrate 101 of FIG. 9.

Referring to FIG. 11, first, a plurality of semiconductor chips 200 are mounted on the semiconductor package substrate 101, and wire bonding is performed. Next, a cover 300 that covers each of the plurality of semiconductor chips 200 is attached to the semiconductor package substrate 101.

The cover 300 includes a bonding portion 310, and the bonding portion 310 is arranged to correspond to the third trench 113 of the semiconductor package substrate 101. The second resin 130 may be arranged in the third trench 113. An adhesive member 320 may be arranged between the bonding portion 310 and the second resin 130.

In addition, a cutting line CL is arranged between the plurality of semiconductor chips 200 or between the covers 300. The fourth trench 114 may be provided to correspond to the cutting line CL, and the fourth trench 114 may be filled with the second resin 130.

After the cover 300 is attached to the semiconductor package substrate 101, the semiconductor package substrate 101 is cut along the cutting line CL to be divided into a plurality of semiconductor packages 10, and thus, manufacture of the semiconductor packages 10 may be completed.

As described above, a semiconductor package substrate and a semiconductor package according to embodiments of the present disclosure each include a base substrate having both sides filled with a resin, and thus, thermal deformation may be significantly reduced.

In addition, the semiconductor package substrate and the semiconductor package according to the embodiments of the present disclosure each include a portion which is bonded to a cover and in which a resin is arranged, and thus, an adhesive force to the cover may increase.

Of course, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A semiconductor package substrate comprising:
a base substrate having a lower surface in which a first trench is provided and an upper surface in which a second trench and a third trench are provided, including a circuit pattern and a conductive material, wherein the third trench is separate and distinct from the second trench;
a first resin arranged in the first trench; and
a second resin arranged in the second trench and the third trench,
wherein the second trench exposes at least a part of the first resin, and wherein an upper surface of the second resin is level with the upper surface of the base substrate, a lower surface of the first resin is level with the lower surface of the base substrate, and the third trench is offset from the first trench so as to be separate from each part of the first trench.

2. The semiconductor package substrate of claim 1, further comprising a mounting portion which is arranged on the upper surface of the base substrate and on which a semiconductor chip is mounted, wherein the third trench is arranged to be farther from the mounting portion than the second trench, and a width of the third trench is greater than a width of the second trench.

3. The semiconductor package substrate of claim 1, wherein the first resin and the second resin are provided as a same type of resin.

4. The semiconductor package substrate of claim 1, further comprising a fourth trench arranged in the upper surface of the base substrate, wherein the fourth trench is arranged along a cutting line.

5. The semiconductor package substrate of claim 4, wherein the second resin is arranged in the fourth trench.

6. A method of manufacturing a semiconductor package substrate, the method comprising:
forming a first trench in a lower surface of a base substrate formed of a conductive material;
filling the first trench with a first resin, wherein a lower surface of the first resin is level with the lower surface of the base substrate;
forming a second trench and a third trench in an upper surface of the base substrate, wherein the third trench is separate and distinct from the second trench; and
filling the second trench and the third trench with a second resin, wherein an upper surface of the second resin is level with the upper surface of the base substrate,
wherein the second trench is formed to expose at least a part of the first resin while the third trench is offset from the first trench so as to be separate from each part of the first trench.

7. The method of claim 6, wherein the upper surface of the base substrate includes a mounting portion on which a semiconductor chip is mounted, the third trench is arranged to be farther from the mounting portion than the second trench, and a width of the third trench is greater than a width of the second trench.

8. The method of claim 6, wherein the first resin and the second resin are formed of a same type of resin.

9. The method of claim 6, wherein a fourth trench is arranged in the upper surface of the base substrate, and the fourth trench is arranged along a cutting line.

10. The method of claim 9, wherein a fifth trench is arranged in the lower surface of the base substrate, and the fifth trench overlaps the fourth trench.

11. A semiconductor package comprising:

a base substrate having a lower surface in which a first trench is provided and an upper surface in which a second trench and a third trench are provided, having a circuit pattern formed in the base substrate, and formed of a conductive material, wherein the third trench is separate and distinct from the second trench;

a first resin arranged in the first trench;

a second resin arranged in the second trench and the third trench;

a semiconductor chip arranged on the upper surface of the base substrate; and a cover configured to cover the semiconductor chip and including a bonding portion bonded to the base substrate, wherein the bonding portion is bonded to the second resin arranged in the third trench, and wherein an upper surface of the second resin is level with the upper surface of the base substrate, a lower surface of the first resin is level with the lower surface of the base substrate, and the third trench is offset from the first trench so as to be separate from each part of the first trench.

12. The semiconductor package of claim 11, further comprising an adhesive member arranged between the bonding portion and the second resin.

13. The semiconductor package of claim 11, wherein a width of the third trench is greater than a width of the second trench.

14. The semiconductor package of claim 11, wherein the first resin and the second resin are formed of a same type of resin.

15. The semiconductor package of claim 11, further comprising a fourth trench provided in an edge of the base substrate, wherein the second resin is arranged in the fourth trench.

\* \* \* \* \*